United States Patent
Nunotani et al.

[11] Patent Number: 6,001,417
[45] Date of Patent: Dec. 14, 1999

[54] RESIST COATING METHOD AND RESIST COATING APPARATUS

[75] Inventors: Shinji Nunotani; Hiroshi Uchida, both of Yokohama, Japan

[73] Assignee: Kabushiki Kaisha Toshiba, Kawasaki, Japan

[21] Appl. No.: 08/932,462

[22] Filed: Sep. 18, 1997

[30] Foreign Application Priority Data

Sep. 18, 1996 [JP] Japan .................................. 8-246586

[51] Int. Cl.⁶ ........................................................ B05D 3/12
[52] U.S. Cl. ........................... 427/240; 427/154; 427/156
[58] Field of Search ................................ 427/240, 241, 427/154, 155, 156

[56] References Cited

U.S. PATENT DOCUMENTS

| | | | |
|---|---|---|---|
| 4,510,176 | 4/1985 | Cuthbert et al. | 427/82 |
| 4,886,728 | 12/1989 | Salamy et al. | 427/240 |
| 5,695,817 | 12/1997 | Tateyama et al. | 427/240 |

*Primary Examiner*—Shrive Beck
*Assistant Examiner*—Paul D. Strain
*Attorney, Agent, or Firm*—Oblon, Spivak, McClelland, Maier & Neustadt, P.C.

[57] ABSTRACT

A resist coating method includes the steps of dripping solvent onto a wafer and rotating the wafer, and then dripping resist onto the wafer and rotating the wafer. Since resist can be dispensed without waste, the total amount of resist used can be reduced. A resist coating apparatus has a wafer support for rotating a wafer placed thereupon, a first nozzle for dripping solvent onto the wafer, a second nozzle for dripping solvent onto the wafer, and a controller for controlling the dripping of resist onto the wafer after solvent has been dripped. By employing this apparatus, the total amount of resist used can thereby be reduced. Furthermore, the total amount of resist used can be further reduced by further providing a temperature controller for lowering the resist temperature to 1–5° C. below room temperature.

7 Claims, 10 Drawing Sheets

RESIST COATING METHOD AND RESIST COATING APPARATUS

BACKGROUND OF THE INVENTION

1. Field of the Invention

The present invention relates to a resist coating method for forming a resist film over a wafer during manufacturing of a semiconductor device, and a resist coating apparatus using said method.

2. Description of the Background Arts

FIG. 11 is a schematic diagram illustrating a configuration of a conventional resist coating apparatus.

The resist coating apparatus 10 shown in FIG. 11 comprises a resist nozzle 2 for dripping resist 6 on the surface of wafer 1, a drive device for moving the resist nozzle 2 as desired above wafer 1, a resist supplier 4 consisting of, for instance, a pump for supplying the resist 6 from a resist storage portion 7 to the resist nozzle 2, a wafer support 8 upon which wafer 1 is held, and a wafer rotating device 5 consisting of, for instance, a motor for rotating the wafer support 8.

The drive device comprises a motor 3 and a belt and such like for rotating a rotatable support spindle of the resist nozzle 2 in accordance with the rotations of the motor. The resist solution supplied here is a solution in which the main component thereof has been adjusted to a suitable density using a solvent (thinner).

The conventional resist coating process will next be explained based on the flowchart shown in FIG. 12 and partial cross-sectional views of FIGS. 13A–13D showing a wafer support with a wafer on the top thereof in various steps.

Firstly, wafer 1, the underside of which has been adsorbed under vacuum, is positioned upon wafer support 8 and resist 6 is dripped from resist nozzle 2 onto wafer 1 approximately in the center thereof at an amount per unit of time of, for instance, 1 cc/sec for 3–4 seconds (Step S11 in FIG. 12; FIG. 13A)

Two types of dripping method are conventionally known: one is a static coating method in which, after the resist 6 has been dripped onto wafer 1, wafer 1 is rotated for a period of 20–25 seconds; and the other is a dynamic coating method in which wafer 1 is rotated for 20–25 seconds while the resist is being dripped. In these methods, a film of resist 6 evenly spreads over the surface of the wafer 1 (Step S12 in FIG. 12; FIG. 13B). The number of these rotations is determined in accordance with the thickness of the resist film. In this step, excess resist is removed by being scattered from the edges of the wafer 1.

Next, the resist 6 on the perimeter of the wafer 1 is removed and the underside of the wafer 1 is cleaned (Step S13 in FIG. 12; FIG. 13C).

Finally, the wafer 1 is rotated once more at high speed and the resist is dried (Step S14 in FIG. 12; FIG. 13D) to form a resist film as desired.

Such conventional methods have the disadvantage that the total amount of resist which needs to be dripped is considerably greater than the amount of resist which is actually left on top of the wafer. For instance, even when the rotation time and the number of rotations in each step are altered, at least 5 cc of resist must be dripped in order to form a resist film with thickness of 2000 nm on an unpatterned wafer with a diameter of 6 inches. Moreover, a patterned wafer with the same diameter would require at least 1 cc of resist to be dripped.

SUMMARY OF THE INVENTION

A primary object of the present invention is to provide a resist coating method which maintains evenness of the thickness of the resist film while reducing the amount of resist dripped.

A secondary object of the present invention is to provide a resist coating apparatus realizing the above method.

According to a first aspect of the present invention, there is provided a resist coating method including the steps of dripping solvent onto a wafer and spreading out the solvent by rotating the wafer, then dripping resist onto the wafer and spreading out the resist by rotating the wafer, thereby enabling the total amount of resist to be greatly reduced.

The resist amount can be further reduced by supplying resist at a temperature 1–5° C. below the room temperature.

According to a second aspect of the present invention, there is provided a resist coating apparatus having a wafer support for rotating a wafer placed thereupon, a first nozzle for dripping resist onto the wafer, a second nozzle for dripping solvent onto the wafer, and a controller for controlling the dripping of resist onto the wafer after solvent has been dripped, thereby enabling the total amount of resist used to be reduced.

The total amount of resist used can be further reduced by additionally providing a temperature controller for lowering the resist temperature to 1–5° C. below the room temperature.

DESCRIPTION OF THE PREFERRED EMBODIMENTS

Figure 1:
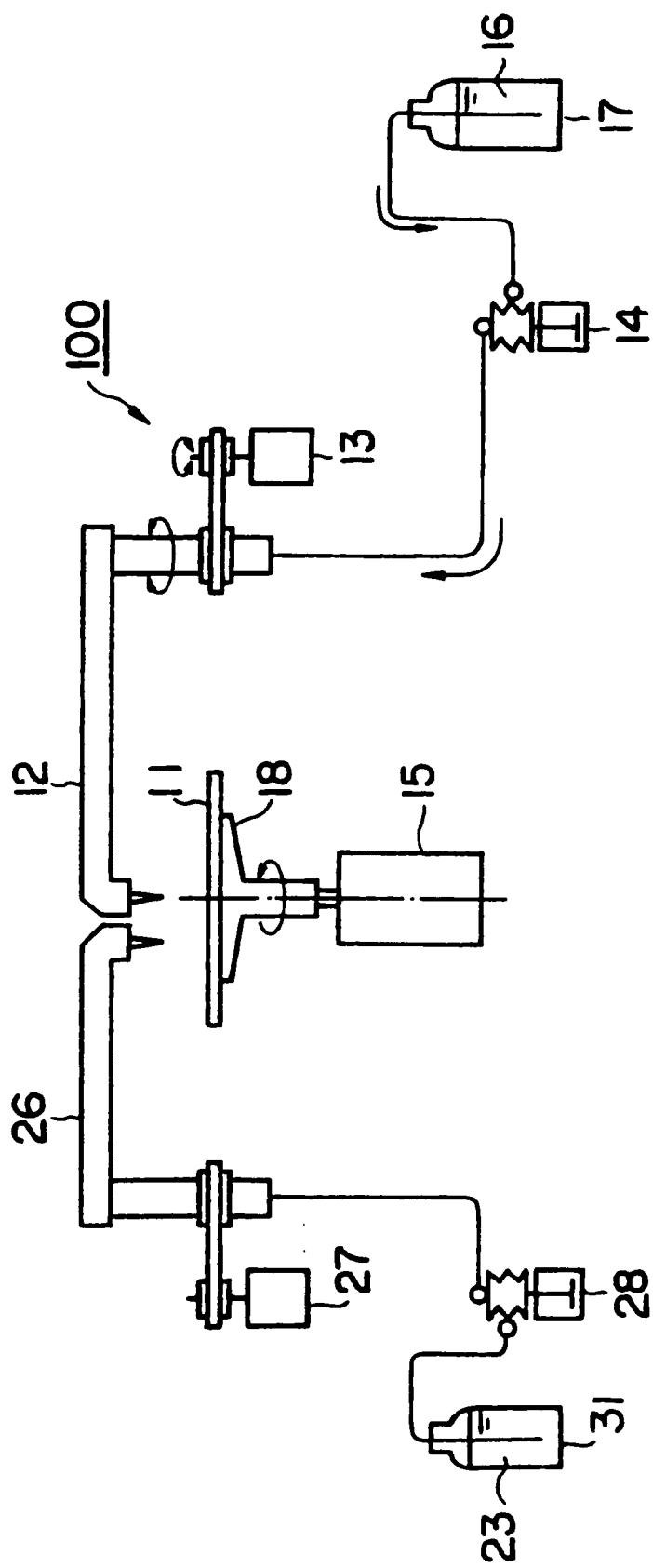
FIG. 1 is a diagram showing a first embodiment of the present invention.

FIG. 1 is a schematic diagram showing the configuration of a resist coating apparatus according to a first embodiment of the present invention.

As FIG. 1 shows, resist coating apparatus 100 comprises a wafer support 18 which holds a wafer 11 under a vacuum, a resist nozzle 12 which drips resist 16 onto the wafer 11, a drive device containing, for instance, a motor 13 which freely moves the resist nozzle 12 above wafer 11, a resist supplier 14 consisting of, for instance, a pump which supplies the resist 16 from a resist storage portion 17 to the resist nozzle 12, and a wafer rotating drive device 15 consisting of, for instance, a motor which rotates wafer support 18.

Furthermore, a solvent nozzle 26 for dripping thinner (solvent) onto wafer 11, a second drive device consisting of, for instance, a motor 27 which moves the solvent nozzle 26 above wafer 11 as desired, a solvent supplier 28 consisting of, for instance, a pump which supplies the solvent 23 from a solvent storage portion 31 to the solvent nozzle 26. The solvent 23 used here is the same type of solvent as contained in the resist 16.

The drive device for the resist nozzle 12 and the drive device for the solvent nozzle 26 rotate the nozzles 12 and 26 by transmitting the forward/reverse rotations of motors 13 and 27 via belts to the spindles of the nozzles 12 and 26, respectively.

Each portion of this resist coating apparatus 100 is controlled by a controller (not shown in the diagram).

The resist coating method of the present invention using the above-mentioned resist coating apparatus 100 will next be explained with reference to the flowchart in FIG. 2 which shows the sequence of steps of coating resist and the partial cross-sectional diagrams in FIGS. 3A–3D which show the wafer and the wafer support in steps of coating resist.

Figure 2:
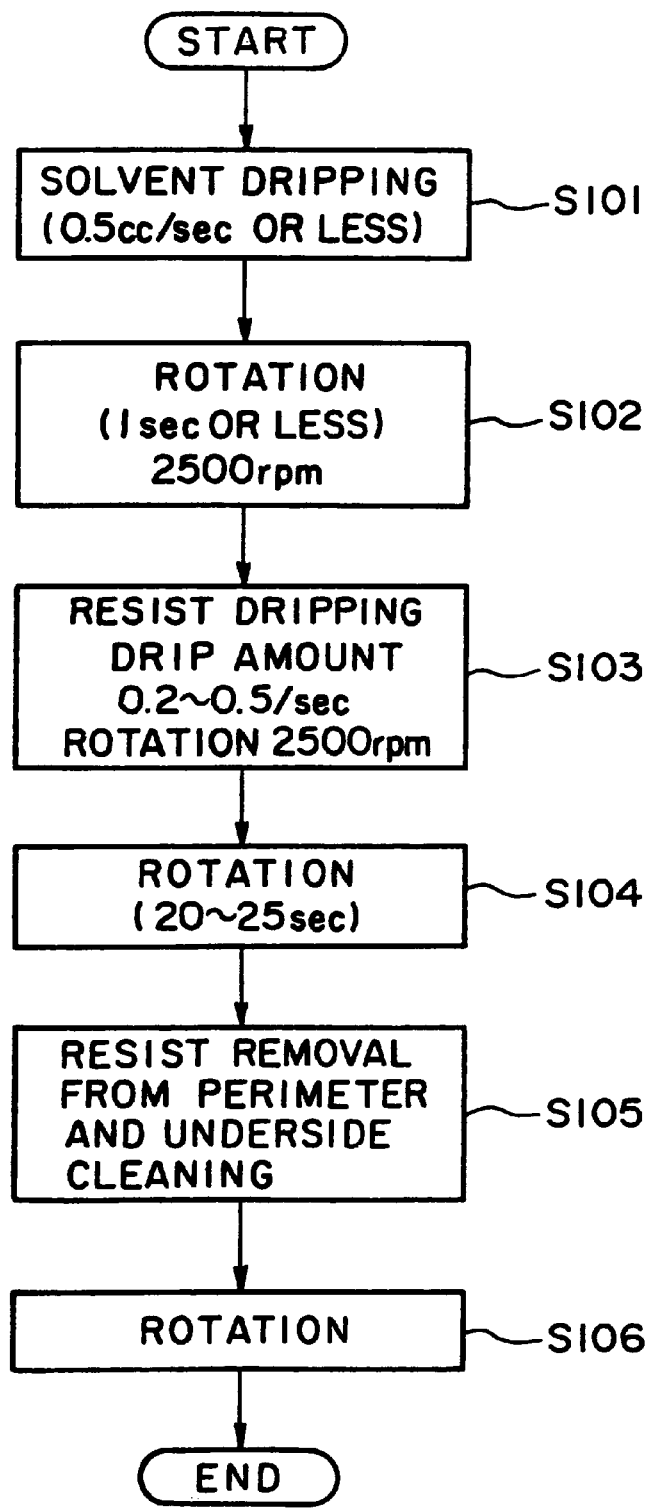
FIG. 2 is a flowchart showing steps of the resist drip sequence according to the first embodiment.
Figure 3A:
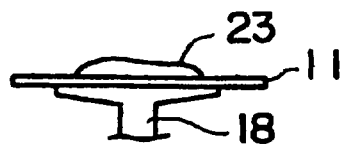
FIGS. 3A, 3B, 3C, 3D, 3E and 3F are partial cross-sectional diagrams showing separate steps of resist dripping process onto a wafer placed on a wafer support according to the first embodiment.
Figure 3B:
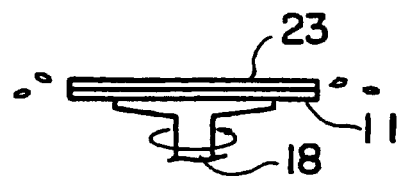
Figure 3C:
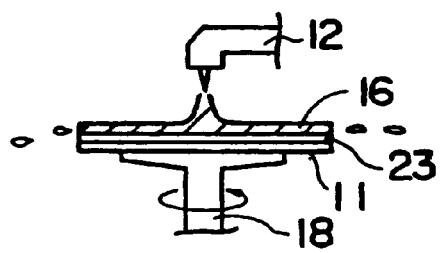

Firstly, wafer 11 is placed on the wafer support 18, the tip of solvent nozzle 26 is shifted to a position above the center portion of wafer 11 and solvent 23 is dripped from the solvent nozzle 26 onto the wafer 11 for 1 second (Step S101 in FIG. 2; FIG. 3A). Since solvent 23 then spreads out, the wafer 11 is rotated at 2500 rpm for not more than 1 second (Step S102 in FIG. 2; FIG. 3B). Once solvent 23 has spread, resist 16 is immediately dripped and the wafer 11 is rotated at 2500 rpm for, for instance, 1 second (Step S103 in FIG. 2; FIG. 3C) and resist 16 spreads out over wafer 11 (dynamic dispense method). In this embodiment, any type of resist, for example, novolak, rubber, polyimide, can be used. A wide range of viscosity, for example 5–10000 cp, of resist is applicable for this invention. Also, any type of solvent, for example PGME (Propylene Glycol mono Metyl Ether), can be used.

Figure 3D:
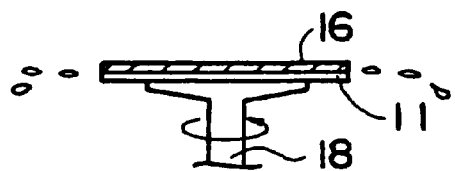
Figure 3E:
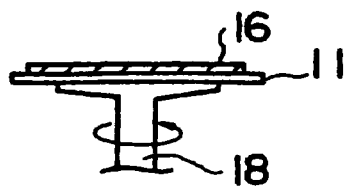
Figure 3F:
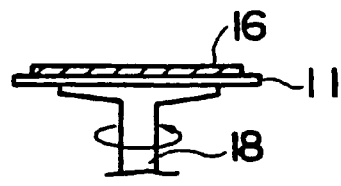

Next, as in a conventional resist coating method, wafer 11 is rotated at high speed for 20–25 seconds (Step S104 in FIG. 2; FIG. 3D). Next, resist 16 around the perimeter of wafer 11 is removed and the underside of wafer 11 is cleaned (Step S105 in FIG. 2; FIG. 3E). Finally, wafer 11 is rotated at high speed in order to dry the resist 16 (Step S106 in FIG. 2; FIG. 3F).

In this method, since the solvent which acts as a thinner for the resist is dripped onto the wafer prior to dripping the resist, the resist spreads effectively and completely over the wafer immediately after the resist being dripped. As a result, wasting resist can be avoided and even resist film thickness can be obtained.

Furthermore, the dripped solvent lower friction between resist and solvent, which makes the resist easier to spread to a broader area. In other words, by applying the solvent prior to dipping the resist, a contact angle of the resist is lowered such that the resist becomes easy to be wetted and spread.

Still further, according to this invention, evenness for patterned surface and unpatterned surface are almost the same. The reason is explained as follows: For the patterned surface, since solvent has far less viscosity, even if there are steps by patterns, the whole surface can be covered by solvent, and as a result an even resist film can be obtained.

Figure 4:
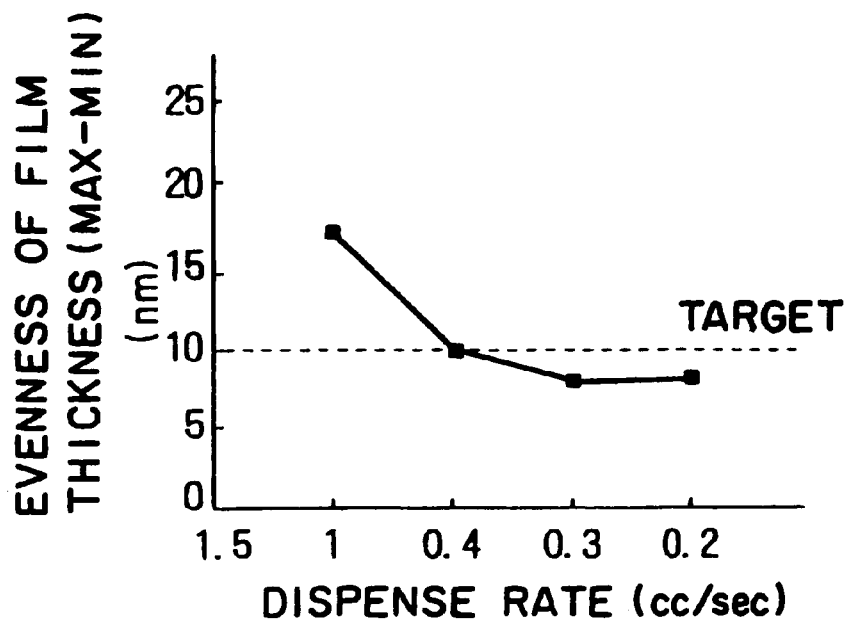
FIG. 4 is a graph showing the relationship between the amount of resist dripped and film thickness.
Figure 5:
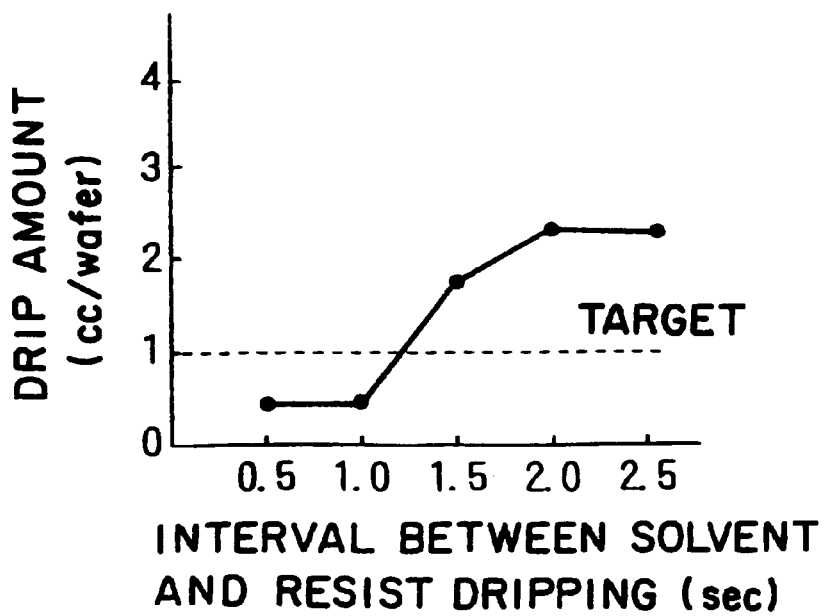
FIG. 5 is a graph showing the relationship between the interval between solvent and resist dripping and the amount of resist dripped.

FIG. 4 and FIG. 5 show data relating to the resist drip amount per unit of time in a case where a resist film with a thickness of 2000 nm has been formed on a wafer of 6 inches in diameter, and the interval between solvent and resist dripping time.

As FIG. 4 shows, the dispense rate which represents the amount dripped per unit of time is within the range 0.2–0.4 cc/sec and the evenness of the resist thickness is below the intended value.

Furthermore, as FIG. 5 shows, when the interval between solvent dispensing and resist coating exceeds 1 second, the dispense amount exceeds the intended value. It can be assumed that this is because the solvent on the wafer dries when the dispensing interval is greater than 1 second.

Figure 6:
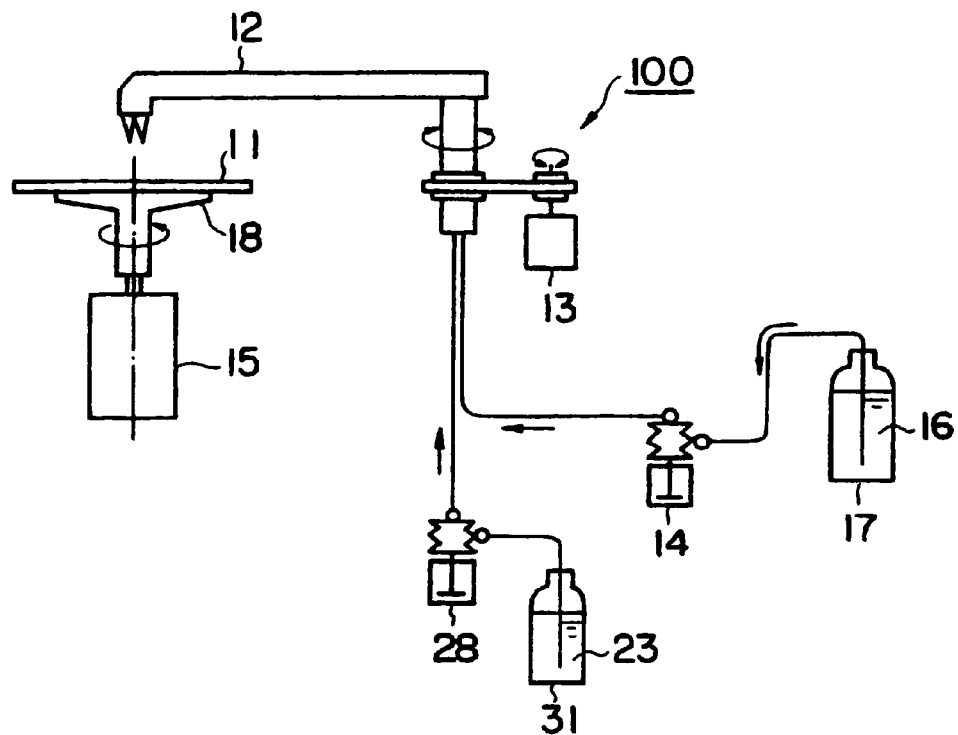
FIG. 6 is a diagram showing a variation of the first embodiment.

In this embodiment, the resist nozzle 12 and the solvent nozzle 26 were provided separately and driven separately, but this is not absolutely necessary. As FIG. 6 shows, both may be driven together by providing a pipe for resist supply and a pipe for solvent supply within the resist nozzle 12.

Figure 7:
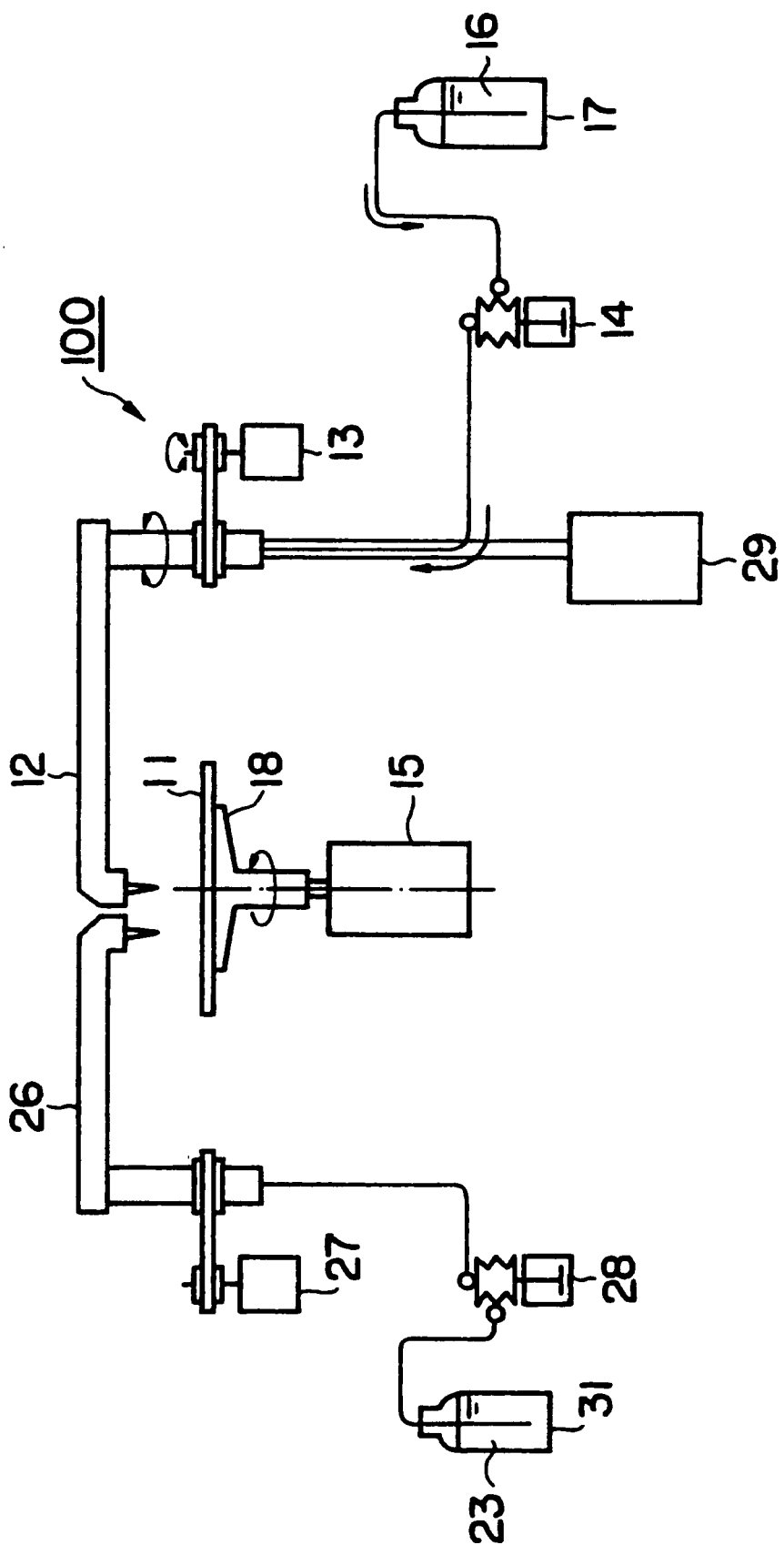
FIG. 7 is a diagram showing a second embodiment of the present invention.

FIG. 7 is schematic diagram showing a configuration of a resist coating apparatus according to a second embodiment of the present invention. Since FIG. 7 has a similar configuration to the embodiment shown in FIG. 1, the same elements of the configuration are indicated by the same reference numerals and detailed explanations thereof are omitted.

The second embodiment differs from the FIG. 1 embodiment in that a temperature controller 29 for cooling resist 16 is provided on the path from the resist supplier 14 to the resist nozzle 12. This temperature controller 29 lowers the temperature of the resist 16 to 1–5° C. below room temperature.

The temperature of the resist is lowered for the following reason.

It is known that, in general, a resist film having a more even thickness within a plane can be obtained by raising the temperature of the resist prior to dripping to 2–3° C. higher than room temperature (i.e. drip atmospheric temperature).

This temperature is most preferable because when resist temperature is too high, the volatility of the resist greatly increases and, as a consequence, the resist film on the perimeter of the wafer is liable to form more thickly. Conversely, when resist temperature is too low, the resist is less volatile and the resist film formed on the perimeter of the wafer is liable to be too thin.

Furthermore, by lowering the atmosphere temperature by dripping solvent, volatilization of solvent contained in the resist solution is prevented and it became possible to spread resist for larger area with less amount of resist.

According to the present invention, resist and solvent are supplied separately and solvent is dripped first. In this case, due to the volatilization of the solvent, the temperature near the wafer (i.e. drip atmospheric temperature) normally drops to 5° C. below room temperature. Therefore, by lowering resist temperature to 1–5° C. below room temperature, a resist temperature which is relatively 2–3° C. higher than drip atmospheric temperature can be obtained when resist is dripped, thereby evening the thickness of the resist.

Figure 8:
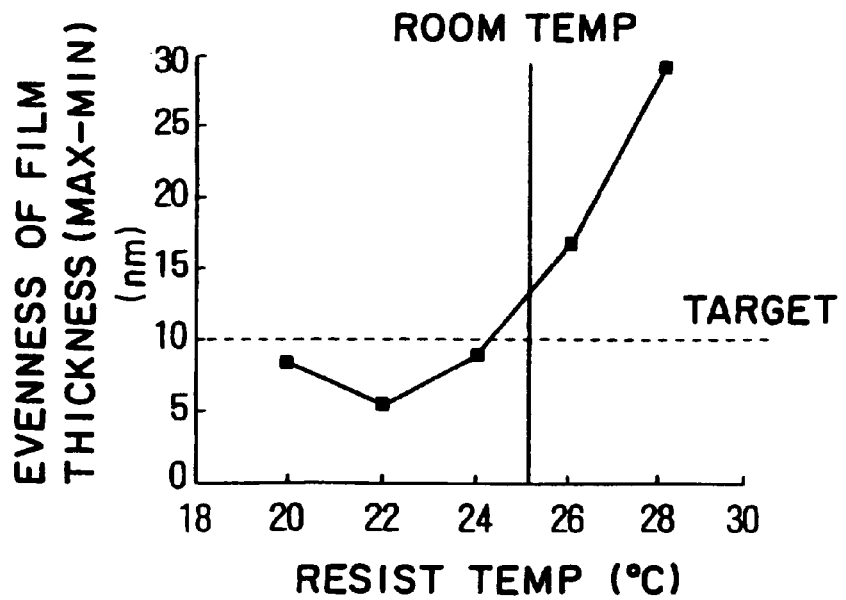
FIG. 8 is a graph showing the relationship between resist temperature and resist film thickness.

FIG. 8 is a graph showing the relationship between resist temperature and evenness of resist thickness. The data shown in FIG. 8 was collected in a case in which a resist film having thickness of 2000nm was formed on a wafer with a 6-inch diameter at room temperature 250° C.

The graph shows that desired evenness of resist thickness can be achieved when resist temperature is lowered to 1–5° C. below room temperature, and that the most favorable resist temperature is 2–4° C. below room temperature.

With this method, a resist film having thickness of 2000 nm can be formed using a total resist drip amount of 0.3 cc dripped onto a patterned wafer with a diameter of, for instance, 6 inches. A considerable reduction in the amount of resist used can thus be obtained.

A resist coating method using the above-mentioned resist coating apparatus will next be explained with reference to FIG. 9 which is a flowchart showing steps of dispensing resist, and FIGS. 10A–10F which is a partial cross-sectional diagram depicting a wafer and a wafer support in each step of resist coating.

Figure 9:
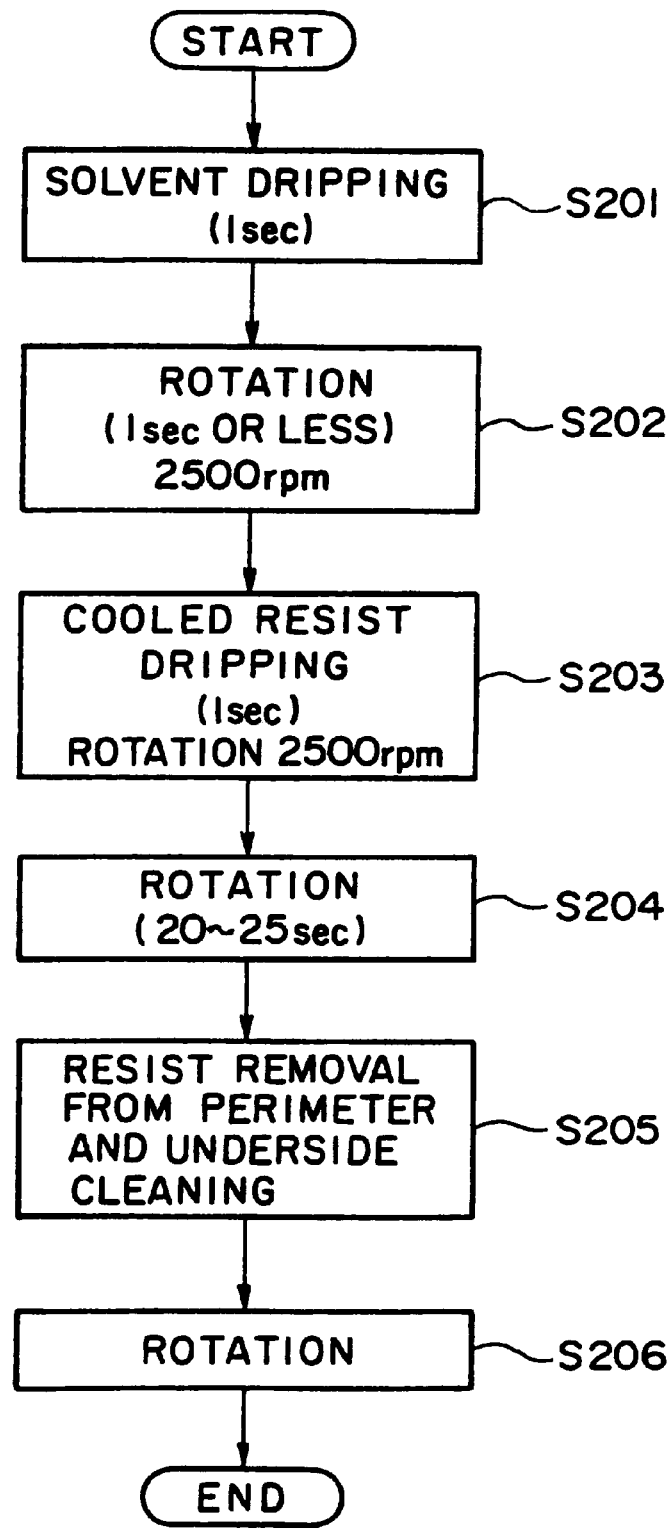
FIG. 9 is a flowchart showing resist dripping sequence according to the second embodiment.
Figure 10A:
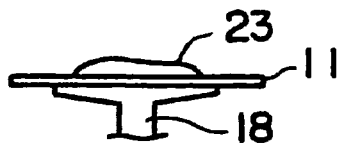
FIGS. 10A–10F are partial cross-sectional diagrams showing separate steps of resist dripping process onto a wafer placed on a wafer support according to the second embodiment.
Figure 10B:
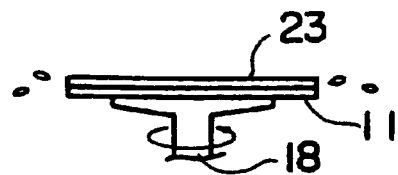
Figure 10C:
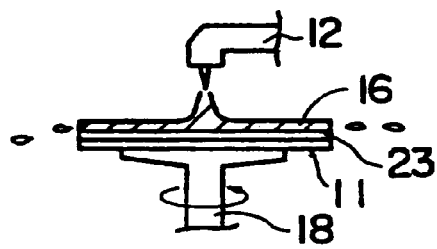

Firstly, the tip of solvent nozzle 26 is shifted to a position above wafer 11 and solvent 23 is dripped from solvent nozzle 26 onto wafer 11 for 1 second (Step S201 in FIG. 9; FIG. 10A). Since solvent 23 then spreads out, the wafer 11 is rotated at 2500 rpm, for instance, for not more than 1 second (Step S202 in FIG. 9; FIG. 10B). Once solvent 23 has spread, resist 16 is immediately dripped from resist nozzle 12 and the wafer 11 is rotated at 2500 rpm, for instance, for 1 second (Step S203 in FIG. 9; FIG. 10C) and resist 16 spreads out over wafer 11 (dynamic coating method). Now, temperature controller 29 is controlling the resist temperature to 1–5° C. below room temperature, as described above.

Figure 10D:
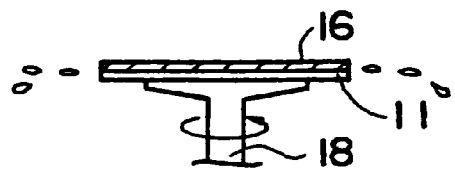
Figure 10E:
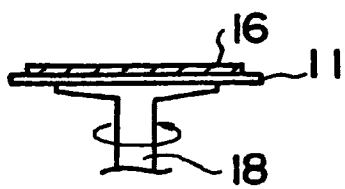
Figure 10F:
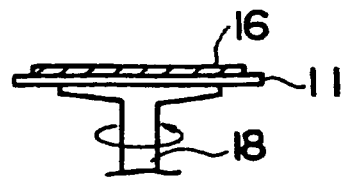
Figure 11:
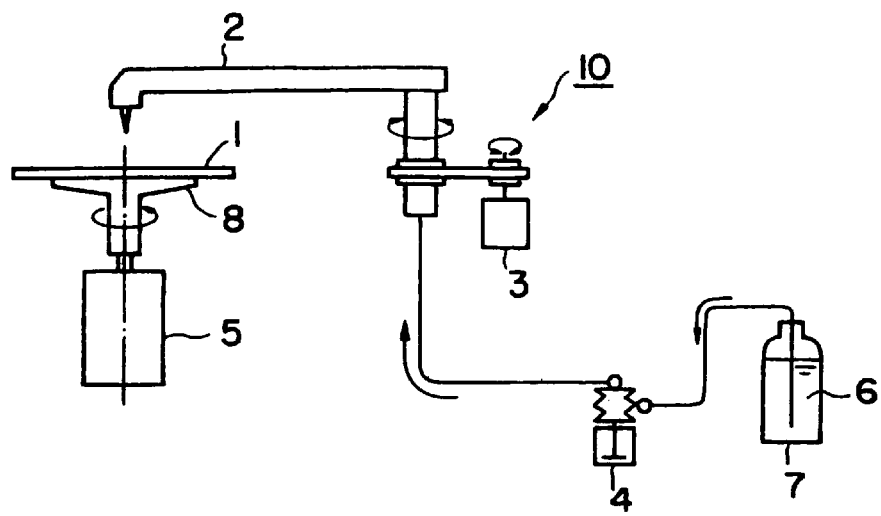
FIG. 11 is a diagram showing a conventional resist coating apparatus.
Figure 12:
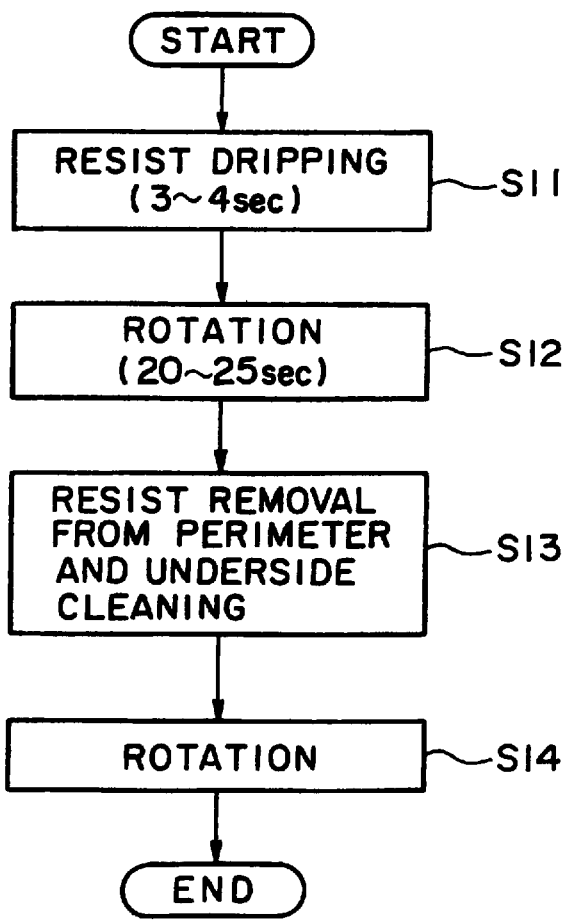
FIG. 12 is a flowchart showing a conventional resist dripping sequence.
Figure 13A:
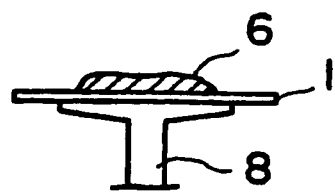
FIGS. 13A, 13B, 13C and 13D are partial cross-sectional diagrams showing separate steps of resist dripping process onto a wafer placed on a wafer support according to conventional technology.
Figure 13B:
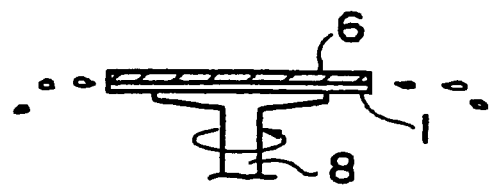
Figure 13C:
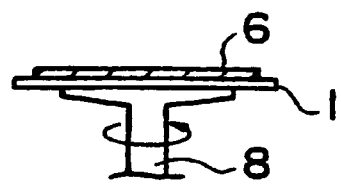
Figure 13D:
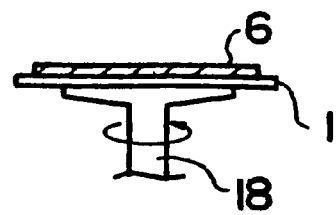

Next, as in a conventional resist coating method, wafer 11 is rotated at 2500 rpm, for instance, for 20–25 seconds (Step S204 in FIG. 9; FIG. 10D). Next, resist 16 around the perimeter of wafer 11 is removed and the underside of wafer 11 is cleaned (Step S205 in FIG. 9; FIG. 10E). Finally, wafer 11 is rotated at high speed in order to dry the resist 16 (Step S206 in FIG. 9; FIG. 10AF).

In this method, by dripping a solvent, which acts as a thinner to the resist, onto the wafer prior to dripping resist and setting the temperature of the resist when dripped to 1–5° C. below room temperature, a resist film of even thickness can be obtained using the minimum amount of resist.

In the second embodiment, the resist nozzle and solvent nozzle were provided separately and driven separately, but this is not necessary. As FIG. 6 shows, a pipe for resist supply and a pipe for solvent supply may both be provided within resist nozzle 12. In this case, of course, temperature controller 29 cools the pipe for resist supply.

The present invention realizes a resist coating apparatus and coating method which maintain evenness of resist film thickness while reducing the amount of resist dripped.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A resist coating method comprising the steps of:

dripping solvent having a first temperature onto a surface of a wafer;

rotating the wafer onto which the solvent has been dripped;

dripping resist having a temperature lowered to 2–3° C. below said first temperature onto the surface of the wafer, said dripping resist being performed before the solvent on the surface of the wafer dries and with the wafer being rotated; and rotating the wafer onto which the resist has been dripped.

2. A resist coating method according to claim 1, further comprising the steps of:

removing resist from a perimeter of the wafer and cleaning an underside of the wafer; and drying and rotating the wafer.

3. A resist coating method according to claim 1, wherein the resist has a drip amount per unit of time of less than 0.5 cc/sec.

4. A resist coating method according to claim 1, wherein rotation speeds after dripping the solvent and during dripping the resist are about 2500 rpm.

5. A resist coating method according to claim 1, wherein time for rotation after dripping the solvent and during dripping the resist are not more than 1 second.

6. A resist coating method according to claim 1, wherein said first temperature is room temperature.

7. A resist coating method according to claim 1, wherein said first temperature is approximately 25° C.

* * * * *